(12) United States Patent
Levanon et al.

(10) Patent No.: US 8,940,474 B2
(45) Date of Patent: *Jan. 27, 2015

(54) METHOD OF PROVIDING LITHOGRAPHIC PRINTING PLATES (71) Applicant: Eastman Kodak Company, Rochester, NY (US)

(72) Inventors: Moshe Levanon, Ness-Ziona (IL); Leonid Askadsky, Bat Yam (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/855,751

(22) Filed: Apr. 3, 2013

(65) Prior Publication Data

US 2013/0224663 A1 Aug. 29, 2013

Related U.S. Application Data

(62) Division of application No. 12/948,812, filed on Nov. 18, 2010, now abandoned.

(51) Int. Cl.
*B41M 7/00* (2006.01)
*B41N 1/00* (2006.01)
(Continued)

(52) U.S. Cl.
CPC ............... *G03F 7/327* (2013.01); *G03F 7/322* (2013.01); *B41C 1/1008* (2013.01); *B41C 2210/02* (2013.01); *B41C 2210/06* (2013.01); *B41C 2210/24* (2013.01)
USPC ...................... 430/302; 430/270.1; 101/450.1; 101/453

(58) Field of Classification Search
CPC .. B41C 1/10; B41C 2210/22; B41C 2210/06; B41C 2210/12; G03F 7/332; G03F 2210/14; G03F 7/322; B41N 1/00; B41N 2210/00
USPC .............. 430/270.1, 302, 309, 329, 378, 399, 430/401, 405, 406, 434, 435, 495.1
See application file for complete search history.

(56) References Cited

U.S. PATENT DOCUMENTS 3,672,821 A 6/1972 Schlussler
4,314,022 A 2/1982 Fisch
(Continued)

FOREIGN PATENT DOCUMENTS

CA 1097491 3/1981
EP 1 715 386 10/2006
(Continued)

OTHER PUBLICATIONS

Ukrainskii Khimicheskii Zhurnal (Russian Ed vol. 488 (1982).
(Continued)

*Primary Examiner* — Chanceity Robinson
(74) *Attorney, Agent, or Firm* — J. Lanny Tucker (57) ABSTRACT

A silicate-free alkaline aqueous developer composition has a pH of at least 12 and comprises a hydroxide alkali agent, a metal cation $M^{2+}$ selected from barium, calcium, strontium, and zinc cations, a chelating agent for the metal cation, and an alkali metal salt that is different than the other components. These developer compositions can be used to process imaged positive-working lithographic printing plate precursors to prepare lithographic printing plates.

19 Claims, 1 Drawing Sheet

(51) Int. Cl.
*G03F 7/00* (2006.01)
*G03F 7/26* (2006.01)
*G03F 7/32* (2006.01)
*B41C 1/10* (2006.01)

(56) References Cited

U.S. PATENT DOCUMENTS

| | | | |
|---|---|---|---|
| 6,162,575 A * | 12/2000 | Fujioka et al. | 430/204 |
| 7,399,576 B1 | 7/2008 | Levanon | |
| 7,544,462 B2 | 6/2009 | Levanon et al. | |
| 2004/0053168 A1 * | 3/2004 | Ohnishi | 430/302 |
| 2005/0112503 A1 | 5/2005 | Kanda et al. | |
| 2005/0130082 A1 | 6/2005 | Kanda et al. | |
| 2006/0154187 A1 | 7/2006 | Wilson et al. | |
| 2009/0162783 A1 * | 6/2009 | Levanon et al. | 430/281.1 |
| 2009/0202948 A1 * | 8/2009 | Simpson et al. | 430/302 |

FOREIGN PATENT DOCUMENTS

| | | |
|---|---|---|
| JP | 08-234448 | 9/1996 |
| JP | 2003-029426 | 1/2003 |

OTHER PUBLICATIONS

Corrosion of Duraluminium in Acid and Alkaline Solutions, by I.A. Ammar, et al. vol. 9, (1962).

Metallic Corrosion Inhibitors, by I.N. Putilova et al, (1960) Chapter 4.

Influence of Some Cation-Citrate Combinations on the Corrosion & Anodic Behaviour of Aluminium in Sodium Hydroxide Solution, by S. Venkitakrishna Iyer et al, Indian J.of Tech, vol. 10, Feb. 1972, pp. 65-66.

Inhibition Effect of Calcium Tartrate on the Corrosion of Pure Aluminum in an Alkaline Solution, by H.B. Shao et al, Corrosion-vol. 57, No. 1 (2001).

The cooperative effect of calcium ions and tartrate ions on the corrosion inhibition of pure aluminum in an alkaline solution, by H.B. Shao et al, Mat. Chem & Physics, 77 (2002) 305-309.

Corrosion Inhibition of an Aluminium—Silicon—Magnesium Alloy in Alkaline Media, by G. Daufin et al, Corrosion Sci, 1977, vol. 17, pp. 901-912.

Mechanisms of corrosion inhibition for an aluminium—silicon—magnesium alloy in 0.1 N NaOH solutions at 60° C., by E. Triki et al, Werkstoffe und Korrosion 30, 259-265 (1979(.

Study of an Inhibiting Aluminosilicate Interface by Infrared Reflection Spectroscopy, by J.P. Labbe, Electronics and Optics, *Thin Solid Films*, 82, (1981) 113-119.

Synthetic chelating agents and compounds exhibiting complexing properties in the aquatic environment, by Thomas Knepper, Trends in Analytical Chemistry, vol. 22, No. 10 (2003).

Study on the Entry of Synthetic Chelating Agents and Compounds Exhibiting Complexing Properties into the Aquatic Environment, by Thomas P. Knepper et al, Vom Wasser, 97, 193-232 (2001).

Aluminum: A Neurotoxic Product of Acid Rain, by R.Bruce Martin, *Acc. Chem. Res.* (1994) 27, pp. 204-210.

Effect of Ethylene Diaminetetraacetic Acid on the Corrosion of Aluminum in Chloride Solutions, by S. Zor et al, *Mat Sci*, vol. 44, No. 6 (2008).

The aluminum chemistry and corrosion in alkaline solution, by Jinsuo Zhang et al, J. of Nuclear Materials, 284 (2009) 175-189.

Phosphonopolycarboxylates as Chemical Assitives for Calcite Scale Dissolution and Metallic Corrosion Inhibition Based on a Calcium-Phosphonotricarboxylate Organic-Inorganic Hybrid, by Konstantinos D. Demadis et al, (2006) Am Chem Soc.

Effects of Structural Differences on Metallic Corrosion Inhibition by Metal-Polyphosphonate Thin Films by Konstantinos D. Demadis et al, *Ind. Eng,. Chem. Res.* 2006, 45, 7795-7800.

U.S. Appl. No. 12/948,808, filed Nov. 18, 2010, titled "Methods of Processing Using Silicate-Free Developer Compositions" by Levanon et al.

U.S. Appl. No. 12/948,814, filed Nov. 18, 2010, titled "Silicate-Free Developer Compositions" by Levanon et al.

* cited by examiner

METHOD OF PROVIDING LITHOGRAPHIC PRINTING PLATES

RELATED APPLICATION

This is a divisional application of copending and commonly assigned U.S. Ser. No. 12/948,812 filed Nov. 18, 2010 by Levanon and Askadsky.

FIELD OF THE INVENTION

This invention relates to methods for using specific silicate-free and sugar-free, alkaline developer compositions to prepare lithographic printing plates from imaged positive-working lithographic printing plate precursors.

BACKGROUND OF THE INVENTION

In conventional or "wet" lithographic printing, ink receptive regions, known as image areas, are generated on a hydrophilic surface. When the surface is moistened with water and lithographic printing ink is applied, the hydrophilic regions retain the water and repel the ink, and the ink receptive regions accept the ink and repel the water. The ink is eventually transferred to the surface of a material upon which the image is to be reproduced.

Lithographic printing precursors useful for preparing lithographic printing plates or sleeves typically comprise one or more imagable layers applied over the hydrophilic surface of a substrate. The imagable layers include one or more radiation-sensitive components that can be dispersed in a suitable binder. Alternatively, the radiation-sensitive component can also be the binder material. Following imaging, either the imaged regions or the non-imaged regions of the imagable layer are removed by a suitable developer, revealing the underlying hydrophilic surface of the substrate. If the imaged regions are removed, the precursor is considered as positive-working. Conversely, if the non-imaged regions are removed, the precursor is considered as negative-working. In each instance, the regions of the imagable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Lithographic printing precursors for the preparation of lithographic printing plates have been developed for use with infrared lasers that image in a platesetter in response to signals from a digital copy of the image in a computer. This "computer-to-plate" technology has generally replaced the former technology where masking films were used to image the precursors.

Early lithographic printing plate precursors for use with infrared lasers typically involve an ablation process, which selectively remove ink receptive or ink repellant surface materials and thereby revealing surfaces of complementary ink affinity. Some examples of such ablative lithographic printing plate precursors are described in U.S. Pat. No. 5,339,737 (Lewis et al.). These lithographic plate precursors typically require a relatively high amount of energy input and thereby have limited productivity when the available infrared laser power is limited. Another drawback of ablative lithographic printing plate precursors is the need to remove debris during imaging, adding to the cost of the imaging equipment and more noise during the operation of such equipment. The first commercial non-ablative lithographic printing plate precursors for use with infrared lasers required a preheat step between infrared laser imaging and image development. Some examples of such lithographic printing plate precursors requiring a preheat step are described in U.S. Pat. No. 5,372,907 (Corbiere et al.). Due to the extra equipment and energy consumption required by the preheat step, lithographic printing plate precursors that do not require a preheat step were designed as described for example in U.S. Pat. No. 6,280,899 (Parsons et al.) and U.S. Pat. No. 6,326,122 (Nagasaka et al.). Such lithographic printing plate precursors are typically positive-working and contain an infrared laser imagable layer comprising novolac resins as the primary binders. These lithographic printing plate precursors typically have limited durability on press and limited resistance to press chemicals, unless such plates are baked at high temperature after image development. The baking step adds to equipment cost and energy consumption.

Various attempts have been made to improve the run length on press and chemical resistance of the no-preheat plates, but each attempt has one or more limitations. For example, no-preheat lithographic printing plate precursors containing some acrylic binders, described in U.S. Pat. No. 6,143,464 (Kawauchi) typically suffer from inadequate differentiation in the solubility in alkaline developers between the IR laser exposed areas and non-exposed areas and from such problems like poor scratch resistance. This inadequate image differentiation often leads to excessive coating loss in the non-IR exposed areas or incomplete removal of the coatings from the IR exposed areas. The image development conditions such as developer strength, temperature, developing time, and brush pressure need to be tightly controlled. Therefore, such lithographic printing plate precursors are considered to have narrow development latitude.

Two-layer no-preheat lithographic plate precursor are described in U.S. Pat. No. 6,294,311 (Shimazu et al.). These lithographic printing plate precursors require manufacturing lines capable of providing two coated layers. Therefore, there is an ongoing desire to develop single-layer, no-preheat, positive-working lithographic plate precursors that exhibit good run length on press and good resistance to press chemicals.

In search of such precursors, it was found that single-layer positive-working lithographic printing plate precursors containing a poly(vinyl acetal) have excellent run length on press and excellent development latitudes. Some examples of such printing plate precursors are described in U.S. Pat. No. 7,399,576 (Levanon et al.) and U.S. Pat. No. 7,544,462 (Levanon et al.) and U.S. Patent Application Publications 2006/0154187 (Wilson et al.) and 2009/0162783 (Levanon et al.). However, there is a continuing need to improve their resistance to certain press chemicals and solvents.

It was found that solvent resistance could be improved using a poly(vinyl acetal) that also includes recurring units having hydroxyaryl ester groups, as described for example, in copending and commonly assigned U.S. Ser. No. 12/555,040 (filed Sep. 9, 2009 by Levanon, Bylina, Kampel, Rubin, Postel, Kurtser, and Nakash). While good run length and solvent resistance were obtained with these plates, there is a continuing need to improve the development latitude with developer compositions.

A specific developer composition is often optimized for developing a particular positive-working lithographic printing plate precursor. There have been attempts to do this by including coating protecting agents in the developer to reduce the solubility of the imagable coating in the non-exposed areas more effectively than the imagable coating in the exposed areas.

One cause of short development cycle and excessive difficulty in cleaning the automatic processor relates to partial dissolution of aluminum oxide film on the substrates of typical lithographic printing plate precursors in the developer solution. Techniques for reducing or eliminating such aluminum oxide attacks include the use of alkali silicates, non-reducing sugars, or lithium salts such as lithium chloride. However, the use of silicate salts itself adds to the dirtiness of the processor bath. It was found that developers containing lithium chloride are very slow in dissolving the infrared laser exposed coating containing polyvinyl acetal that also has hydroxyaryl ester groups and therefore are considered unsuitable for processing such precursors.

These problems are addressed using the method described and claimed in copending and commonly assigned U.S. Ser. No. 12/948,808 filed on Nov. 18, 2010 by Levanon, Huang, and Askadsky. Improved image discrimination was achieved with the described lithographic printing plate precursors by processing them using a developer composition having a pH of at least 12 and comprising at least 0.001 gram-atom/kg of a metal cation $M^{2+}$ such as barium, calcium ions, strontium, and zinc cations.

Other useful developer compositions are described and claimed in copending and commonly assigned U.S. Ser. No. 12/948,814 filed on Nov. 18, 2010 by Levanon and Askadsky.

The presence of $M^{2+}$ cations such as calcium ions in the developer composition also acts to protect the aluminum substrate from attack by the highly alkaline developer.

During a processing cycle, when the developer is "loaded" with dissolved coating materials, a problem known as "sharpening" become evident. "Sharpening" occurs when the developing composition becomes more aggressive in its developing activity so that the non-exposed regions in the imagable layer are attacked by the developer composition, resulting in increased printing plate weight loss and decreased dot size ("dot sharpening") in the resulting printed imaged.

Thus, while the inventions described in the noted copending and co-filed applications solves certain problems, there is an additional need to find a way to maintain stable performance for a long time during high loading of the developer composition with dissolved coating materials from the processed lithographic printing plate precursors.

SUMMARY OF THE INVENTION

Thus, this invention provides a silicate-free and sugar-free alkaline aqueous developer composition having a pH of at least 12 and comprising:
(a) a hydroxide,
(b) a metal cation $M^{2+}$ selected from barium, calcium, strontium, and zinc cations,
(c) a chelating agent for the metal cation $M^{+2}$, and
(d) an alkali metal salt different than all of a, b, and c above.

Some specific embodiments of this invention include developer compositions having a pH of at least 12 and up to and including 13.5, and comprising:
a sodium or potassium hydroxide,
an alkali metal citrate,
$M^{2+}$ is calcium or strontium metal cation, and a chelating agent that has a complex formation constant (log K) for the calcium or strontium metal cation of at least 3.5 and less than or equal to 4.5, and a log K for aluminum ion that is less than or equal to 7.

This invention also provides a method for providing a lithographic printing plate comprising:
A) imagewise exposing a positive-working lithographic printing plate precursor having an imagable layer to provide exposed and non-exposed regions, and
B) processing the exposed lithographic printing plate precursor with a developer composition of this invention to remove the exposed regions in the imagable layer.

Thus, this method can be carried out with lithographic printing plate precursors having a single-positive-working imagable layer that comprises a polymeric binder comprising recurring units represented by either or both of the following Structures (Ia) and (Ib), in random order:

$$\mathrm{-\!\!+\!CH_2\!-\!CH\!-\!CH_2\!-\!CH\!+\!\!-} \quad \text{(Ia)}$$
$$\underset{\underset{R}{|}}{\overset{O\diagdown\phantom{xx}\diagup O}{\phantom{X}\mathrm{CH}\phantom{X}}}$$

$$\mathrm{-\!\!+\!CH_2\!-\!CH\!+\!\!-} \quad \text{(Ib)}$$
$$\underset{\underset{R_2}{\overset{\|}{C}=O}}{\overset{|}{O}}$$

wherein:
when both the Structure (Ia) and (Ib) recurring units are present, the Structure (Ia) recurring units are present in an amount of at least 10 and up to and including 35 mol %, and the Structure (Ib) recurring units are present in an amount of at least 25 and up to and including 60 mol %, all based on total recurring units in the polymeric binder,
R is a substituted or unsubstituted hydroxyaryl group, and
$R_2$ is a substituted or unsubstituted hydroxyaryl group in which the hydroxyl group is ortho to the ester linkage.

Moreover, the method can also be carried out using a silicate-free and sugar-free developer composition that has a pH of at least 12 and up to and including 13.5 and comprises:
sodium or potassium hydroxide,
calcium or strontium ions,
sodium or potassium citrate ions,
2-phosphonobutane-1,2,4-tricarboxylic acid, and
either or both of an anionic surfactant and a cationic surfactant.

This invention also provides a kit useful for providing lithographic printing plates, the kit comprising:
a) one or more positive-working lithographic printing plate precursors, each precursor having a substrate and an outermost imagable layer that comprises a polymer binder, and
b) a silicate-free and sugar-free alkaline aqueous developer composition of this invention.

This kit includes a combination of the lithographic printing plate precursors that can be supplied in any number (usually in the hundreds) in suitable cartons or packages, and the noted developer composition that is supplied in suitable containers. The components of the kit can be separately ordered and supplied from a single or multiple sources or distributors, or they can be ordered and supplied together from the same source or distributor.

The developer compositions can be used as an aqueous alkaline developer to process imaged positive-working lithographic printing plate precursors. The developers compositions are free of silicates and metasilicates and free of sugars (for example, non-reducing sugars), meaning that none of these compounds are purposely added or incorporated by any means into the developer compositions. Although silicates are effective inhibitors for inhibiting dissolution of aluminum oxide in such developers, the presence of a silicate in a developer composition causes precipitation of water-insoluble aluminosilicates that contaminate the processing bath and complicates the cleaning of the processing apparatus.

While the presence of the noted metal ions present in the developer composition serves as extremely effective inhibitors for the non-imaged areas of the positive-working lithographic printing plate precursors, the so-called "sharpening" effect was recognized as an additional problem to be solved. We found that this problem can be reduced by the presence of a suitable alkali metal salt as defined herein such as citric acid (or in the form of a citrate) in the developer composition.

DETAILED DESCRIPTION OF THE INVENTION

As used herein, the terms "lithographic printing plate precursor", "printing plate precursor", "positive-working lithographic printing plate precursor", and "precursor" refer to the positive-working imagable elements that can be used in the practice of this invention.

Unless otherwise indicated, as used herein, the terms "developer composition" and "developer" refer to the compositions of the present invention.

Developer Compositions

There are various embodiments of developer compositions that can be used to advantage to solve the problems noted above. All of the developer compositions have a pH of at least 12 and typically at least 12 and up to and including 13.5, or more likely at least 12.5 and up to and including 13.5. This highly alkaline pH is generally provided using one or more alkali agents, as long as silicates and metasilicates are not present (not purposely added).

Useful alkali agents include hydroxides such as alkali metal hydroxides, for example sodium hydroxide and potassium hydroxide. In some embodiments, both sodium and potassium ions are present as part of the hydroxide. Where this is true, it can be desirable that the potassium ions be more prevalent than the sodium ions, for example at a molar ratio of potassium to sodium ions of greater than 1:1. The total amount of the alkali metal ions is generally at least 0.3 and up to and including 1 gram-atom/kg.

The developer compositions also include one or more metal cations $M^{2+}$ that are selected from barium, calcium, strontium, and zinc cations. Calcium, strontium, and zinc cations are particularly useful, and in some embodiments, calcium is particularly advantageous to protect the surface of the imagable layer containing certain polymeric binders, for example polymeric binder comprising recurring units defined by Structure (Ib) noted above.

The metal cations $M^{2+}$ are generally present in the developer compositions in an amount of at least 0.001 gram-atom/kg, and typically at least 0.001 and up to and including 0.01 gram-atom/kg. The metal cations $M^{2+}$ can be introduced to the developer composition using corresponding salts.

The developer compositions further include one or more chelating agents for the $M^{2+}$ metal cation, which chelating agents would be readily apparent to one skilled in the art and typically include two or more electron-donating centers such as lone pair electrons and anionic groups in each molecule. The two or more electron donating centers are typically capable of forming one or more cyclic structures with $M^{2+}$ cations with ionic or coordination bonds between the electron donating centers and $M^{2+}$ cation.

In many embodiments, the chelating agent has a complex formation constant (log K) for the $M^{2+}$ metal cation of at least 3.5 and less than or equal to 4.5, and a log K for aluminum ion that is 7 or less. In many of such embodiments, the $M^{2+}$ metal cation that is used with the chelating agent is either calcium or strontium, and calcium is the most likely metal cation. Useful chelating agents with these properties include but are not limited to, phosphono-polycarboxylic acids such as phosphonoalkyl polycarboxylic acids, such as 2-phosphonobutane-1,2,4-tricarboxylic acid, which is particularly useful with calcium metal cations.

The described chelating agents are generally present in the developer composition an amount of at least 0.01 and up to and including 0.1 mol/liter, or typically at least 0.03 and up to and including 0.1 mol/liter.

The developer composition also includes one or more alkali metal salts having one or more $X^{n-}$ anions or salts thereof. Such anions are different than any anions provided by any other components of the developer composition. These anions can be anions of inorganic or organic carboxylic acids. Such anions generally do not include phosphono groups, unlike the chelating agents described above. Examples of useful $X^{n-}$ anions (and anion portions of corresponding salts) include but are not limited to, nitric acid (nitrate), carbonic acid (carbonate), citric acid (citrate), acetate, tartaric acid (tartrate), and oxalate. Citrate alkali metal salts are particularly useful. The noted $X^{n-}$ anions are generally present in an amount of at least 0.05 mol/liter and up to and including 0.2 mol/liter, and typically at least 0.07 mol/liter and up to and including 0.15 mol/liter.

An optional but desirable component of the developer composition is a cationic or betaine surfactant. Two or more cationic surfactants can also be used, and the total amount is generally at least 0.01 weight % and typically at least 0.1 and up to and including 3 weight %. The cationic surfactant can help moderate the developer composition aggressiveness (further improve image discrimination) in the non-imaged areas (areas not to be removed) of the imaged lithographic printing precursor, especially those comprising recurring units represented by Structure (Ia) below. Suitable cationic surfactants for use in the present invention include, but are not limited to, quaternary ammonium halides of fatty acids such as a fatty acid quaternary ammonium chloride. One example of such cationic surfactants is provided in Hydromax 300 (Chemax Performance Products, Grenville, S.C.) that is described for example, in U.S. Patent Application Publication 2006/0154187 (Wilson et al.).

The developer composition can also comprise one or more surfactants to achieve the best wetting, stabilizing, solubilizing, protecting, dispersing, or rinsing properties. Such surfactants are generally anionic or nonionic in nature. Both types can be present. Useful anionic surfactants are of the alkylaryl sulfonates class, such as an alkylaryl sulfonate, for example, alkyldiphenyloxide disulfonate that is available as Dowfax® 2A1 from Dow Chemical Co. The anionic and nonionic surfactants can be present in an amount of at least 0.1 and up to and including 2 weight %.

Some embodiments of the developer compositions have a pH of at least 12 and up to and including 13.5, wherein the $M^{2+}$ is calcium or strontium metal cation, and further comprise:
 a sodium or potassium hydroxide,
 sodium or potassium citrate, and
 2-phosphonobutane-1,2,4-tricarboxylic acid.

Still other embodiments include a developer composition that has a pH of at least 12 and up to and including 13.5, wherein $M^{2+}$ is calcium metal cation, and the developer composition further comprises:

an alkali metal hydroxide, sodium or potassium citrate, 2-phosphonobutane-1,2,4-tricarboxylic acid, and a cationic surfactant, and the polymer binder in the outermost imagable layer comprises recurring units represented by either or both Structures (Ia) and (Ib) described herein.

The developer compositions can further comprise hydrotropes, biocides, antifoaming agents, and gumming materials that provide protection of the developed printing plate, all in known quantities.

The developer composition can be prepared by dissolving the components in water. It can be supplied in a form ready to use, or it can also be provided in a form of a concentrate, which is diluted up to 9 times with water or an aqueous alkaline solution prior to use.

Although each developer composition can also be used as its own replenisher, more likely, a specially formulated replenisher can be used. In the replenisher composition, the concentration of alkali agent is generally higher than the concentration of the alkali agent in the developer composition, to compensate for the consumption of the alkali agent during the development process. There is often a correlation between the value of the ionic conductivity and the value of alkalinity of the total developer composition bath.

In some embodiments, the replenisher composition not only has more alkali agent (such as hydroxide), but it can also have an increased amount of the $M^{2+}$ cation, chelating agent, alkali metal salt, or cationic surfactant.

Positive-Working Lithographic Printing Plate Precursors 5

The present invention can be used to process imaged positive-working imagable element comprising a substrate having thereon an imagable layer comprising a water-insoluble polymeric binder, and a radiation absorbing compound, wherein the polymeric binder comprises, in random fashion:

a) vinyl acetal recurring units comprising pendant hydroxyaryl groups, b) recurring units comprising aromatic ester (such as hydroxyaryl ester) groups, or c) either or both types of recurring units (Ia) and (Ib), in random fashion.

In many embodiments, the processed precursors have polymeric binders comprising both Structures (Ia) and (Ib) types of recurring units, in random fashion, in the imagable layer.

For purposes of this invention, the polymeric binder defined as having at least recurring units of Structure (Ia) or (Ib), or both Structures (Ia) and (Ib), are considered as "primary" polymeric binders. As noted below, the primary polymeric binders must be present in the imagable layer, but they are not necessarily the only polymeric binders in the imagable layer.

In most embodiments, the polymeric binder comprises recurring units represented by either or both of the following Structures (Ia) and (Ib), in random fashion:

that are described in more detail below. When the recurring units of Structure (Ia) are present in the polymeric binder, they are present in an amount of at least 10 and up to and including 35 mol %. When the recurring units of Structure (Ib) are present in the polymeric binder, they are present in an amount of at least 25 and up to and including 60 mol %, all based on the total recurring units in the polymeric binder.

Still other embodiments include the use of a polymeric binder that comprises, in random fashion, in addition to the recurring units from Structures (Ia) and (Ib), at least 25 and up to and including 60 mol % of recurring units represented by the following Structure (Ic), in random fashion:

and optionally up to 25 mol % of recurring units represented by the following Structure (Id), optionally up to 10 mol % of recurring units represented by the following Structure (Ie), and optionally up to 20 mol % of recurring units represented by the following Structure (If), all based on the total recurring units in the polymeric binder, in random fashion:

which Structures (Ic) through (If) are described in more detail below.

In Structures (Ia) and (Ib), R is a substituted or unsubstituted hydroxyaryl group such as a substituted or unsubstituted hydroxyphenyl or hydroxynaphthyl group wherein the aryl group has 1 to 3 hydroxyl groups on the ring. Typically, there is only 1 hydroxyl group on the aryl ring. Other substituents that can optionally be present on the aryl group include but are not limited to, alkyl, alkoxy, halogen, and any other group that does not adversely affect the performance of the polymeric binder in the imagable element.

In Structure (Ib), $R_2$ is a substituted or unsubstituted hydroxyaryl group in which the hydroxyl group is ortho to the ester linkage. Some of the $R_2$ groups are substituted with a cyclic imide group, for example a substituted or unsubstituted hydroxyphenyl or hydroxynaphthyl group that has a cyclic imide substituent such as an aliphatic or aromatic imide group, including but not limited to, maleimide, phthalimide, tetrachlorophthalimide, hydroxyphthalimide, carboxyphthalimide, and naphthalimide groups. Further optional substituents on $R_2$ include but are not limited to, hydroxyl, alkyl, alkoxy, halogen, and other groups that do not adversely affect the properties of the cyclic imide group or the polymeric binder in the imagable element. A hydroxyphenyl group, with a cyclic imide substituent and no other substituents, is useful in the polymeric binder.

In Structure (Id), $R_1$ is hydrogen or a substituted or unsubstituted linear or branched alkyl group having 1 to 12 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, iso-hexyl, and dodecyl groups), a substituted or unsubstituted cycloalkyl having 5 to 10 carbon atoms in the carbocyclic ring (such as cyclopentyl, cyclohexyl, 4-methylcyclohexyl, and 4-chlorocyclohexyl), or a substituted or unsubstituted aryl group having 6 or 10 carbon atoms in the aromatic ring (such as phenyl, naphthyl, p-methylphenyl, and p-chlorophenyl). Such groups can be substituted with one or more substituents such as alkyl, alkoxy, halogen, or any other substituent that a skilled worker would readily contemplate that would not adversely affect the performance of the polymeric binder in the imagable element.

In Structure (Ie), $R_3$ is an aryl group (such as phenyl or naphthyl group) that is substituted with an $-O_x-(CH_2)_y-COOH$ group wherein x is 0 or 1 and y is 0, 1, or 2. Typically, x is 1 and y is 1, and the aryl group is a phenyl group. This aryl group can have further substituents such as alkyl, alkoxy, or halogen that do not adversely affect the performance of the polymeric binder in the imagable element.

In Structure (If), $R_4$ is a substituted or unsubstituted aryl group having 6 or 10 carbon atoms in the aromatic ring (such as phenyl or naphthyl) and that can have one or more substituents such as alkyl, alkoxy, and others that a skilled worker would readily contemplate as not adversely affecting the properties of the polymeric binder in the imagable element.

In some embodiments, the polymeric binder comprises recurring units represented by each of Structures (Ia) through (If), all in random fashion:

(Ia)

-continued (Ib)

(Ic)

(Id)

(Ie)

(If)

wherein R, $R_1$, $R_2$, $R_3$, $R_4$, x and y are as defined above, k is at least 15 and up to and including 25 mol %, l is at least 25 and up to and including 45 mol %, m is at least 30 and up to and including 55 mol %, n is 0 or up to and including 15 mol %, is 0 or up to and including 8 mol %, and p is 0 or up to and including 10 mol %, all based on total recurring units in the polymeric binder.

In yet other embodiments, the polymeric binder comprises recurring units represented by each of Structures (Ia) through (Id), in random fashion:

(Ia)

(Ib)

(Ic)

(Id)

wherein R, $R_1$, and $R_2$ are as defined above.

Further, other embodiments include the use of the polymeric binder that comprises recurring units represented by each of Structures (Ia) through (Ie), in random fashion:

(Ia)

(Ib)

(Ic)

(Id)

(Ie)

wherein R, $R_1$, $R_2$, $R_3$, x, and y are as defined above.

A primary polymeric binder comprising recurring units that are represented by Structures (Ia) or (Ib), or both Structures (Ia) and (Ib) and optionally (Ic), (Id), (Ie), or (If) can contain recurring units other than those defined by the illustrated recurring units, all in random fashion, and such additional recurring units would be readily apparent to a skilled worker in the art. Thus, the polymeric binders useful in this invention are not limited specifically to the recurring units defined by Structures (Ia) through (If). Where two or more types of recurring units are present in the primary binder, the recurring units are present in a random fashion. If blocks of recurring units are present, they exist inadvertently because there is no intent to intentionally cause the formation of blocks of recurring units.

There also can be multiple types of recurring units from any of the defined classes of recurring units in Structures (Ia), (Ib), (Id), (Ie), and (If) with different substituents. For example, there can be multiple types of recurring units with different R groups, there can be multiple types of recurring units with different $R_1$ groups, there can be multiple types of recurring units with different $R_2$ groups, there can be multiple types of recurring units with different $R_3$ groups, or there can be multiple types of recurring units with different $R_4$ groups.

The primary polymeric binder is generally present in an amount of at 40 and up to and including 95 weight % (typically at least 50 and up to and including 80 weight %) based on the total dry weight of the imagable layer.

The primary polymer binders used in the positive-working lithographic printing plates can be prepared by trans-esterification of alkyl or aryl esters of hydroxy-substituted aromatic acids with polyvinyl alcohol in the presence of basic catalysts such as metal hydroxides, metal alkoxides, and cyclic amines in dimethylsulfoxide (DMSO) or N-methylpyrrolidone (NMP) or mixtures of these solvents with γ-butyrolactone (BLO).

Some embodiments of the primary polymeric binders have pendant hydroxyaryl groups that are substituted with a cyclic imide (such as a phthalimide group) on the aromatic ring. Such polymers can be prepared by trans-esterification of cyclic imide derivatives of alkyl or aryl esters of hydroxyl-substituted aromatic acids with polyvinyl alcohol in the presence of basic catalysts such as metal hydroxides, metal alkoxides or cyclic amines in DMSO or NMP, or mixtures of these solvents with BLO or by trans-esterification of mixtures of cyclic imide derivatives of alkyl and aryl esters of hydroxyl-substituted aromatic acids with polyvinyl alcohol in the presence of basic catalysts such as metal hydroxides, metal alkoxides or cyclic amines in DMSO or NMP or mixtures of these solvents with BLO.

The primary polymeric binders described herein can be used alone or in admixture with other alkali soluble polymeric binders, identified herein as "secondary polymeric binders". These additional polymeric binders include other poly(vinyl acetal)s, for example, the poly(vinyl acetal)s described in U.S. Pat. Nos. 6,255,033 and 6,541,181 (noted above), WO 04/081662 (also noted above), and in U.S. Patent Application Publication 2008/0206678 (Levanon et al.), which publications are incorporated herein by reference.

The type of the secondary polymeric binder that can be used together with the primary polymeric binder is not particularly restricted. In general, from a viewpoint of not diminishing the positive radiation-sensitivity of the imagable element, the secondary polymeric binder is generally an alkali-soluble polymer.

Other useful secondary polymeric binders include phenolic resins, including novolak and resole resins such as condensation polymers of phenol and formaldehyde, condensation polymers of m-cresol and formaldehyde, condensation polymers of p-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Examples of other useful secondary polymeric binders include the following classes of polymers having an acidic group in (1) through (5) shown below on a main chain and/or side chain (pendant group).

(1) sulfone amide ($-SO_2NH-R'$), (2) substituted sulfonamido based acid group (hereinafter, referred to as active imido group) [such as $-SO_2NHCOR'$, $SO_2NHSO_2R'$, $-CONHSO_2'$], (3) carboxylic acid group ($-CO_2H$),

(4) sulfonic acid group ($-SO_3H$), and (5) phosphoric acid group ($-OPO_3H_2$).

R' in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfonamide group such as m-aminosulfonylphenyl methacrylate, N-(p-aminosulfonylphenyl) methacrylamide, or N-(p-aminosulfonylphenyl) acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula.

N-(p-toluenesulfonyl) methacrylamide and N-(p-toluenesulfonyl) acrylamide are examples of such polymerizable compounds.

Secondary polymeric binders having any of the groups (3) through (5) include those readily prepared by reacting ethylenically unsaturated polymerizable monomers having the desired acidic groups, or groups that can be converted to such acidic groups after polymerization.

The secondary polymeric binder can have a weight average molecular weight of at least 2,000 and a number average molecular weight of at least 500. Typically, the weight average molecular weight is at least 5,000 and up to and including 300,000, the number average molecular weight is at least 800 and up to and including 250,000, and the degree of dispersion (weight average molecular weight/number average molecular weight) is at least 1.1 and up to and including 10.

Mixtures of the secondary polymeric binders can be used with the one or more primary polymeric binders. The secondary polymeric binder(s) can be present in an amount of at least 1 weight % and up to and including 50 weight %, and typically from at least 5 and up to and including 30 weight %, based on the dry weight of the total polymeric binders in the radiation-sensitive composition or imagable layer.

The imagable layer in the lithographic printing plate precursors can also include one or more developability-enhancing compounds. WO 2004/081662 (Memetea et al.) describes the use of various developability-enhancing compounds of acidic nature to enhance the sensitivity of positive-working compositions and elements so that required imaging energy is reduced. Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides can permit further improved developing latitude and printing durability. Representative examples of such compounds are provided in [0030] to [0036] of U.S. Patent Application Publication 2005/0214677 (noted above) that is incorporated herein by reference with respect to these acid developability-enhancing compounds.

The imagable layer can also include a developability-enhancing composition containing one or more basic developability-enhancing compounds (BDEC) as described in U.S. Pat. No. 7,544,462 (Levanon et al.) and one or more developability enhancing compounds (DEC) as described in U.S. Patent Publication No. 2009/0162783 (Levanon et al.), both which are incorporated herein by reference. For example, the DEC compounds are organic compounds having at least one amino group and at least one carboxylic acid group, particularly if at least one amino group is directly linked to an aryl group. The DEC compounds can be represented by the following Structure (DEC):

wherein $R_1$ and $R_2$ are independently hydrogen or substituted or unsubstituted alkyl, substituted or unsubstituted cycloalkyl, or substituted or unsubstituted aryl groups, A is a substituted or unsubstituted organic linking group having at least one carbon, nitrogen, sulfur, or oxygen atom in the chain, wherein A also comprises a substituted or unsubstituted arylene group directly connected to $-[N(R_1)(R_2)]_n$, m is an integer of 1 to 4, and n is an integer of 1 to 4.

The lithographic printing plate precursors are positive-working and the primary polymeric binders described herein are present in a single surface imagable layer.

This surface imagable layer can also contain hydroxymandelic acid in an amount of at least 0.1 and up to and including 1 weight % based on the total imagable layer dry weight.

In general, the lithographic printing plate precursors are formed by suitable application of a formulation of the imagable layer composition that contains one or more primary polymeric binders, a radiation absorbing compound (described below), optionally a developability-enhancing composition, and other optional addenda, to a suitable substrate to form an imagable layer. This substrate is usually treated or coated in various ways as described below prior to application of the formulation. For example, the substrate can be treated to provide an "interlayer" for improved adhesion or hydrophilicity, and the imagable layer is applied over the interlayer.

The substrate generally has a hydrophilic surface, or a surface that is more hydrophilic than the applied imagable layer formulation on the imaging side. The substrate comprises a support that can be composed of any material that is conventionally used to prepare lithographic printing plate precursors. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that can be coated or treated including physical graining, electrochemical graining and chemical graining, followed by anodizing. The aluminum sheet is mechanically or electrochemically grained and anodized using phosphoric acid or sulfuric acid and conventional procedures.

An optional interlayer can be formed by treatment of the aluminum support with, for example, a silicate, dextrin, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution, or an alkali salt of a condensed aryl sulfonic acid as described in GB 2,098,627 and Japanese Kokai 57-195697A (both Herting et al.). The grained and anodized aluminum support can be treated with a solution of a phosphate (such as $NaH_2PO_4$) and sodium fluoride to improve surface hydrophilicity.

The thickness of the substrate can be varied but should be sufficient to sustain the wear from printing and thin enough to wrap around a printing form. Some embodiments include a treated aluminum foil having a thickness of from at least 100 and up to and including 600 μm.

The backside (non-imaging side) of the substrate can be coated with a slipping or matte layer to improve handling and "feel" of the imagable element.

The substrate can also be a cylindrical surface having the imagable layer composition applied thereon, and thus be an integral part of the printing press. The use of such imaged cylinders is described for example in U.S. Pat. No. 5,713,287 (Gelbart).

The imagable layer (and radiation-sensitive composition) typically also comprises one or more radiation absorbing compounds that are typically sensitive to infrared radiation and thus, the radiation absorbing compounds are known as infrared radiation absorbing compounds ("IR absorbing compounds") that generally absorb radiation of at least 700 and up to and including 1400 nm and typically of at least 750 and up to and including 1250 nm.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye can have a chromophore having two heterocyclic groups. In another embodiment, the cyanine dye can have from about two sulfonic acid groups, such as two sulfonic acid groups and two indolenine groups as described for example in U.S Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imagable layer and usually the pigment particle size will be less than half the thickness of the imagable layer.

In the lithographic printing plate precursors, the radiation absorbing compound is generally present at a dry coverage of at least 0.1 and up to and including 30 weight %, or it is an IR dye that is present in an amount of at least 0.5 and up to and including 15 weight %. The particular amount needed for this purpose would be readily apparent to one skilled in the art, depending upon the specific compound used.

Alternatively, the radiation absorbing compounds can be included in a separate layer that is in thermal contact with the imagable layer. Thus, during imaging, the action of the radiation absorbing compound in the separate layer can be transferred to the imagable layer without the compound originally being incorporated into it.

The imagable layer (and radiation-sensitive composition) can also include one or more additional compounds that are colorant pigments or dyes, or UV or visible light-sensitive components. Pigment colorants can be organic colorants that are generally insoluble in less than 0.1 g/liter of coating solvents that are generally used to apply the radiation-sensitive imagable layer to a substrate. Such coating solvents generally have hydroxyl, ester, ether, carbonyl, carboxy, amide, or nitrile groups and having a boiling point of at least 30° and up to and including 250° C. Classes of useful pigment colorants include but are not limited to, phthalocyanines, perylenes, and azo pigments. Colorant dyes that are soluble in an alkaline developer are also useful. Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) regions in the developed lithographic printing plate.

The imagable layer (and radiation-sensitive composition) can further include a variety of additives including dispersing agents, humectants, biocides, plasticizers, surfactants for coatability or other properties, viscosity builders, fillers and extenders, pH adjusters, drying agents, defoamers, preservatives, antioxidants, development aids, rheology modifiers or combinations thereof, or any other addenda commonly used in the lithographic art, in the usual amounts.

The positive-working lithographic printing plate precursors can be prepared by applying the imagable layer (radiation-sensitive composition) formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the imagable layer is at least 0.5 and up to and including 3.5 g/m$^2$ and typically at least 1 and up to and including 3 g/m$^2$.

The selection of solvents used to coat the layer formulation(s) depends upon the nature of the polymeric binders and other polymeric materials and non-polymeric components in the formulations. Generally, the imagable layer formulation is coated out of acetone, methyl ethyl ketone, or another ketone, tetrahydrofuran, 1-methoxy-2-propanol, N-methylpyrrolidone, 1-methoxy-2-propyl acetate, γ-butyrolactone, and mixtures.

Intermediate drying steps can be used between applications of the various layer formulations to remove solvent(s) before coating other formulations. Drying steps can also help in preventing the mixing of the various layers.

Representative methods for preparing positive-working lithographic printing plate precursors are described below in the examples.

After the imagable layer formulation is dried on the substrate (that is, the coating is self-supporting and dry to the touch), the lithographic printing plate precursor can be heat treated at a temperature of at least 40 and up to and including 90° C. (typically at from at least 50 and up to and including 70° C.) for at least 4 hours and typically at least 20 hours, or for at least 24 hours. The maximum heat treatment time can be several days, but the optimal time and temperature for the heat treatment can be readily determined by routine experimentation. This heat treatment can also be known as a "conditioning" step. Such treatments are described for example, in EP 823,327 (Nagaska et al.) and EP 1,024,958 (McCullough et al.).

It is also be desirable that during the heat treatment, the lithographic printing plate precursor is wrapped or encased in a water-impermeable sheet material to represent an effective barrier to moisture removal from the precursor. More details of this process are provided in U.S. Pat. No. 7,175,969 (Ray et al.).

Imaging and Development

The lithographic printing plate precursors used in this invention can have any useful form. The precursors can be of any useful size and shape (for example, square or rectangular) having the requisite single positive-working imagable layer disposed on a suitable substrate.

During use, the lithographic printing plate precursors are exposed to a suitable source of infrared radiation at a wavelength using an infrared laser at a wavelength of at least 700 and up to and including 1400 nm. The laser used to expose the imaging member is can be a diode laser, because of the reliability and low maintenance of diode laser systems, but other lasers such as gas or solid-state lasers can also be used. The combination of power, intensity and exposure time for laser imaging would be readily apparent to one skilled in the art. Presently, high performance lasers or laser diodes used in commercially available imagesetters emit infrared radiation at one or more wavelengths with the range of from at least 750 and up to and including 1250 nm.

The imaging apparatus can function solely as a platesetter or it can be incorporated directly into a lithographic printing press. In the latter case, printing can commence immediately after imaging, thereby reducing press set-up time considerably. The imaging apparatus can be configured as a flatbed recorder or as a drum recorder, with the lithographic printing plate precursor mounted to the interior or exterior cylindrical surface of the drum. A useful imaging apparatus is available as models of Kodak Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image a lithographic printing plate precursor while it is attached to the printing plate cylinder. An example of a suitable direct imaging printing press includes the Heidelberg SM74-DI press (available from Heidelberg, Dayton, Ohio). IR Imaging speeds can be at least 30 and up to and including 1500 mJ/cm$^2$ or typically at least 40 and up to and including 300 mJ/cm$^2$.

While laser imaging is usually practiced, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files can be generated by a raster image processor (RIP) or other suitable means. The bitmaps are constructed to define the hue of the color as well as screen frequencies and angles.

Imaging of the lithographic printing plate precursor produces an imaged precursor that comprises a latent image of imaged (exposed) and non-imaged (non-exposed) regions. Developing the imaged precursor with the developer composition of this invention removes predominantly only the exposed regions of the imagable layer and any layers underneath it, and exposing the hydrophilic surface of the substrate (that generally contains aluminum). Development is carried out for a time sufficient to remove the imaged (exposed) regions of the imagable layer, but not long enough to remove the non-imaged (non-exposed) regions of the imagable layer. The imaged (exposed) regions of the imagable layer are described as being "soluble" or "removable" in the developer composition because they are removed, dissolved, or dispersed within the developer more readily than the non-imaged (non-exposed) regions of the imagable layer. Thus, the term "soluble" also means "dispersible".

Generally, the developer composition is applied to the imaged precursor by rubbing or wiping it with an applicator containing the developer composition. Alternatively, the imaged precursor can be brushed with the developer composition, or the developer composition can be applied by spraying the imaged precursor with sufficient force to remove the exposed regions. Still again, the imaged precursor can be immersed in the developer composition. In all instances, a developed image is produced in a lithographic printing plate. Development can be carried out in suitable apparatus containing suitable rollers, brushes, tanks, and plumbing for delivery, disposal, or recirculation of solutions if desired. Development using dip tanks are particularly useful.

The developer composition can be added as a "working strength" solution or it can be added as a "concentrate" that is diluted at least 1.5 times and up to and including 2.5 times with water or an aqueous alkaline solution. The concentrated form of the developer compositions would then have appropriate concentrations of the various components so that, upon dilution with water or an aqueous alkaline solution, or both, the resulting working strength developer composition then has the desired amounts of each component.

During development, the developer composition can be replenished with fresh amounts of the same solution, or it can be replenished with a developer composition replenisher that has similar or different concentrations of various components. For example, the developer replenisher composition can have a higher concentration of hydroxide, $M^{2+}$ metal cation, as well as other components such as a cationic surfactant, chelating agent, or alkali metal salt. The higher concentration can be as little as 5% higher and up to and including 20% higher concentrations of the desired components.

The rate of replenishment would be readily determined by routine experimentation based on the area of precursors being processed. In most instances, the rate of replenishment can be monitored and controlled by measuring the conductivity of the developer composition in the processing tank, to maintain the conductivity as close to a target conductivity as possible. If the conductivity becomes too high during replenishment, a diluent such as plain water can also be added to the processing tank.

Following development, the lithographic printing plate can be rinsed with water and dried in a suitable fashion. It can also be treated with a conventional gumming solution (such as gum arabic).

The resulting lithographic printing plate can also be baked in a post-exposure bake operation that can be carried out to increase run length. Baking can be carried out at a temperature of at least 220° C. and up to and including 260° C. for from at least 0.5 and up to and including 10 minutes, or at about 120° C. for about 30 minutes.

Printing can be carried out by applying a lithographic ink and fountain solution to the printing surface of the lithographic printing plate. The ink is taken up by the non-imaged (non-exposed or non-removed) regions of the imagable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the printing plate to the receiving material. The lithographic printing plates can be cleaned between impressions, if desired, using conventional cleaning means and chemicals.

The following Examples are provided to illustrate the practice of this invention and they are not meant to be limiting to the scope of the invention in any manner.

The following materials were used in the preparation and use of the examples. Unless otherwise indicated, the materials were obtained from Aldrich Chemical Company (Milwaukee, Wis.).

Bayhibit® AM is a 50% aqueous solution of 2-phosphonobutane-1,2,4-tricarboxilic acid, "PBTC" (Bayer AG).

Hydromax 300 is a 40% aqueous solution of an organic fatty acid quaternary ammonium chloride mixture (Chemax Performance Products, Greenville, S.C.).

Dowfax® 2A1 is an anionic alkyldiphenyloxide disulfonate (Dow Chemical Company).

Potassium citrate is citric acid tripotassium salt, monohydrate.

Sodium citrate is citric acid trisodium salt dihydrate.

Potassium nitrate is nitric acid potassium salt.

ABA represents 4-aminobenzoic acid.

BLO represents γ-butyrolactone

MEK represents methyl ethyl ketone.

BPA 1100 is a resole resin that was obtained from AZEM (Wiesbaden).

DBU represents 1,8-diazabicyclo[5,4,0]undec-7-ene (98%).

Dioxalane is 1,3-dioxalane.

DMABA represents 4-(dimethylamino)benzoic acid.

DMSO represents dimethylsulfoxide.

NMP represents N-methylpyrrolidone.

Polyfox® PF 652 is a surfactant (Omnova).

PM represents 1-methoxy-2-propanol that can be obtained as Arcosolve® PM from LyondellBasell Industries (the Netherlands).

S0094 is an infrared radiation absorbing dye ($\lambda_{max}$=813 nm) that was obtained from FEW Chemicals (Germany).

Sudan Black B is a neutral diazo dye (C.U. 26150).

Victoria Blue R is a triarylmethane dye (Basic Blue 11, C.I. 44040).

Precursor 1:

A lithographic printing plate precursor was prepared according to Invention Example 2 of U.S. Patent Application Publication 2009/0162783 A1 (Levanon et al.) having the positive-working imagable layer formulation shown in [0213] and containing DMABA as the developability enhancing compound. This publication is incorporated herein by reference.

Precursor 2:

Precursor 2 that was prepared according to Example 12 of copending and commonly assigned U.S. Ser. No. 12/555,040 (noted above) that is incorporated herein by reference, with the exception that instead of Polymer I, Polymer H was used. The imagable layer is prepared from a coating formulation contained the following components:

| | |
|---|---|
| Polymer H | 0.762 g |
| BPA1100 | 0.12 g |
| S 0094 IR Dye | 0.026 g |
| Victoria Blue R | 0.011 g |
| Sudan Black B | 0.021 g |
| ABA | 0.11 g |
| Polyfox ® PF 652 surfactant (10% in PM) | 0.031 g |
| BLO | 2.69 g |
| Dioxalane | 3.24 g |
| PM | 3.50 g |
| MEK | 3.24 g |

This coating formulation was filtered and applied to an electrochemically roughened and anodized aluminum substrate that had been subjected to a treatment using an aqueous solution of sodium phosphate and sodium fluoride by means of known methods. The resulting imagable layer coating was dried for 30 seconds at 130° C. in Glunz&Jensen "Unigraph Quartz" oven. The dry coating weight of the resulting positive-working imagable layer was about 1.5 g/m². The resulting lithographic printing plate Precursor 2 was further treated in an oven at 62° C. and 29% relative humidity for 24 hours.

Invention Example 1

A sample of Precursor 1 was exposed using the Kodak® Magnus 400 Quantum imager at a range of energies, 50 mJ/cm² to 200 mJ/cm² and processed in a Mercury Mark VI processor using Developer 1 (shown below) at 23° C. for 20 seconds.

| Developer 1 | |
|---|---|
| Component | Concentration % |
| KOH | 2.70 |
| Potassium citrate | 1.75 |
| Bayhibit ® AM | 0.50 |
| CaCl$_2$ × 2H$_2$O | 0.04 |
| DowFax ® 2A1 | 0.50 |
| Hydromax 300 | 0.10 |
| Water | 94.4 |

The results are shown in the following table.

| Corrosion, Weight loss (Δm/S, g/m²) | CDL % | Clearing Point (mJ/cm²) | Linearity Point (mJ/cm²) |
|---|---|---|---|
| 0.02 | 0.8 | 50 | 90 |

Clearing Point is the lowest imaging energy at which the exposed regions were completely removed by the developer at a given temperature and time. Linearity Point is the energy at which the 50% dots at 200 lpi screen are reproduced as 50%±0.2% dots). Cyan Density Loss (CDL %) provides a measure of the resistance of the non-exposed regions on the lithographic printing plate to the developer. CDL % is calculated using the following formula.

$$CDL \% = (OD_b - OD_a)/OD_b \times 100$$

wherein $OD_a$ is the optical density of the non-exposed coating after development and $OD_b$ is the optical density of the non-exposed coating before development. The optical densities were measured using an X-Rite 500 Series Spectrodensitometer with a cyan filter.

The corrosion weight loss data provide a measure of the resistance of the substrate under the imagable layer to the developer. It was measured on a 16 cm×16 cm square of the uncoated substrate. The weight loss was measured by comparing the initial weight of the aluminum square with the weight of the aluminum square after it had been treated in the developer for 30 seconds at 23° C., rinsed with water, and dried.

Loading Test for Developer 1:

One liter samples of Developer 1 were "loaded" with the solid components used in the imagable layer of Precursor 1 in amounts corresponding to 1.5 m²/l, 3 m²/l, 4.5 m²/l, 6 m²/l, and 9 m²/l. An imaged Precursor 1 was then manually processed in a 2 liter plastic dish using the loaded developer samples at 23° C. for 20 seconds dwell time after imaging on the exposure device described above. The results are summarized in the following table.

| Plate Loading Level (m²/liter) | CDL (%) | Dot 50% (100 mJ/cm²) |
|---|---|---|
| 0 | 2.2 | 49.3 |
| 1.5 | 3.0 | 49.4 |
| 3.0 | 2.6 | 49.5 |
| 6.0 | 2.2 | 50.0 |
| 9.0 | 0.7 | 50.2 |

These results show that the image quality in terms of CDL and 50% dot readings using Precursor 1 is stable after Developer 1 is loaded with the coating components used in Precursor 1.

Invention Example 2

Invention Example 1 was repeated using samples of Precursor 2. The results obtained using fresh Developer 1 through an automatic processor are summarized in the following table.

| Corrosion, Weight loss (Δm/S, g/m²) | CDL % | Clearing Point (mJ/cm²) | Linearity Point (mJ/cm²) |
|---|---|---|---|
| 0.02 | 0.5 | 60 | 100 |

In a loading test, a sample of Precursor 2 was imaged in the same way as in Invention Example 1 and was developed by hand using samples of Samples of Developer 1 that had been loaded with coating ingredients contained in the imagable layer of Precursor 1 in amounts corresponding to loading levels of 1.5 m²/l, 3 m²/l, 4.5 m²/l, 6 m²/l, and 9 m²/l. The samples of Developer 1 were tested at 23° C. and 25 seconds dwell time. The following table shows the results of these tests.

| Plate Loading Level (m²/liter) | CDL (%) | Dot 50% (100 mJ/cm²) |
|---|---|---|
| 0 | 0.9 | 49.6 |
| 1.5 | 0.7 | 49.5 |
| 3.0 | 1.1 | 49.8 |
| 6.0 | 1.0 | 50.3 |
| 9.0 | 1.0 | 50.6 |

These results show that the image quality in terms of CDL and 50% dot readings using Precursor 2 is stable after Developer 1 was loaded with the coating components used in Precursor 1. The same stable performance for lithographic printing plate derived from Precursor 2 was observed when Developer 1 was loaded with coating components of Precursor 2.

Invention Example 3

This example illustrates a process for maintaining the stability of Developer 1 in a Kodak Mercury Marc VI Processor during a loading cycle using 1030 cm×800 cm samples of Precursor 1 with its entire imagable layer imaged using a Kodak Magnus 400 Quantum imaging device at 100 mJ/cm² and using 1030 cm×800 cm samples of Precursors 1 and 2 imaged on the same imaging device with patterns containing areas representing 1% dots up to 99% dots at 200 LPI for image quality evaluation. The processor was set at a printing plate transport speed of 1500 min/min (20 seconds dwell time) except that when test samples of Precursor 2 were processed, the transport speed was adjusted to 1700 mm/min (17 seconds dwell time). The developer tank temperature was set at 23° C. at all times and Developer 1 was replenished with Replenisher 1 at a rate of 40 ml/m² of processed plates and 1 liter was added every 24 hours. The composition of Replenisher 1 is described in the following table.

| Replenisher 1 | |
|---|---|
| Component | Concentration % |
| KOH | 3.00 |
| Potassium citrate | 1.75 |
| Bayhibit ® AM | 0.50 |
| CaCl$_2$ × 2H$_2$O | 0.043 |
| DowFax ® 2A1 | 0.50 |
| Hydromax 300 | 0.103 |
| Water | 94.1 |

Figure 1:
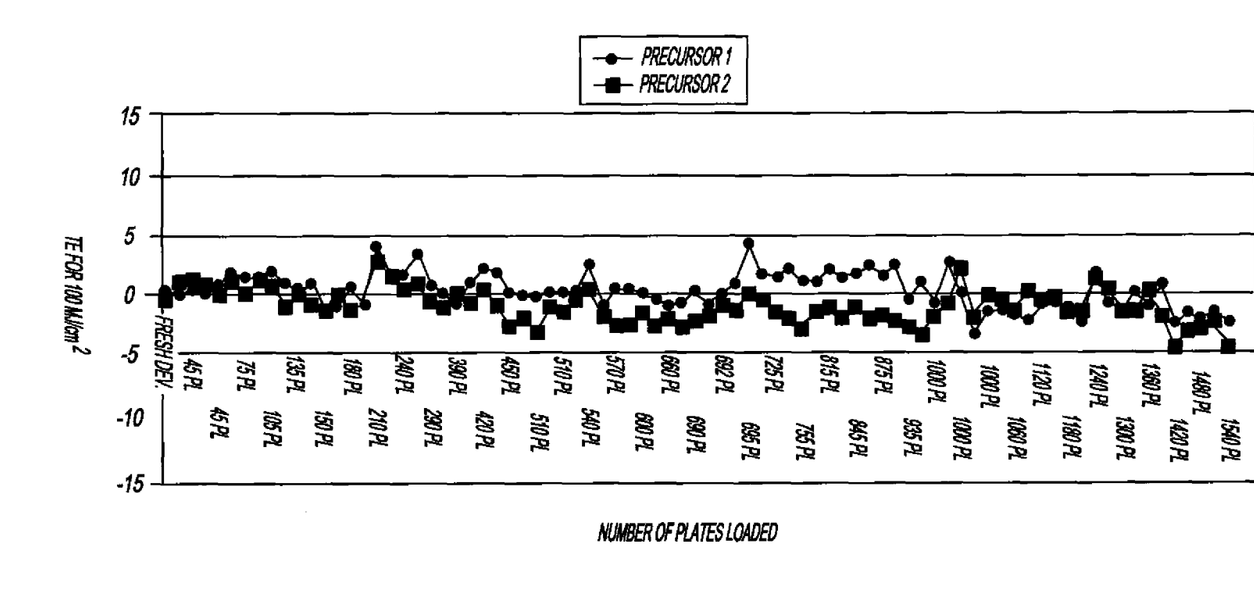
FIG. 1 is a graphical representation of the results of the Loading Test in Developer 1 as described below in Invention Example 3.

The samples of Precursors 1 and 2 were processed after processing every 30 m² of fully imaged Precursor 1. Dot reproduction was measured for each developed test precursor using a Techkon SpectroPlate microscope. The results were represented as TE (total error) that is a sum of all deviations measured for a series of 17 different dot patterns (2%-98%) and given in FIG. 1 as a graph of TE (at 100 mJ/cm²) vs. the number of loaded imaged precursors ("pl") over time in the developer bath (from fresh developer to loaded 1540 plates). The developer was replenished with Replenisher 1 at 40 ml/m² and 1 liter of Replenisher 1 every 24 hours.

The results show very stable image quality of both Precursors 1 and 2 at the low rate of replenishment. When the developer composition was discharged from the processor, only a simple water rinse was needed to clean the processor. The filter was not clogged and no sludge was observed.

Comparative Examples 1 and 2

To illustrate relatively poor stability for developers without citric acid salts, Invention Examples 1 (Precursor 1) and 2 (Precursor 2) were repeated except that Developer 1 was replaced with Developer 2, described below. Developer 2 does not contain an alkali metal salt anion X⁻.

| Developer 2 | |
|---|---|
| Component | Concentration % |
| KOH | 3.20 |
| Bayhibit ® AM | 0.50 |
| CaCl$_2$ × 2H$_2$O | 0.04 |
| DowFax ® 2A1 | 0.50 |
| Hydromax 300 | 0.10 |
| Water | 95.7 |

The results of the loading tests are summarized below.

| | Developer 2 Loading Test (Samples of Precursor 1 Loaded) | | | |
|---|---|---|---|---|
| | CDL (%) | | Dot 50% (100 mJ/cm²) | |
| Plate Loading, m²/liter | Comparative Example 1 (Precursor 1) | Comparative Example 2 (Precursor 2) | Comparative Example 1 (Precursor 1) | Comparative Example 2 (Precursor 2) |
| 0 | 1.1 | 0.4 | 49.6 | 49.8 |
| 1.5 | 1.8 | 0.7 | 49.3 | 49.1 |
| 3.0 | 5.5 | 3.3 | 48.1 | 48.0 |

As these results show, Developer 2 loaded with only 3 m²/liter of Precursor 1 coating components became aggressive towards Precursors 1 and 2, leading to higher CDL (sharpening) and lower 50% dot readings.

The invention has been described in detail with particular reference to certain preferred embodiments thereof, but it will be understood that variations and modifications can be effected within the spirit and scope of the invention.

The invention claimed is:

1. A method for providing a lithographic printing plate comprising:
    A) imagewise exposing a positive-working lithographic printing plate precursor having an imageable layer to provide exposed and non-exposed regions using infrared radiation,
    wherein the imageable layer comprises an infrared radiation absorbing compound and a primary polymeric binder in an amount of at least 40 weight % and up to and including 95 weight %, based on the total dry weight of the imageable layer, the primary polymeric binder comprising recurring units represented by either or both of the following Structures (Ia) and (Ib), in random order:

wherein:
    when both Structure (Ia) and (Ib) recurring units are present, the Structure (Ia) recurring units are present in an amount of at least 10 and up to and including 35 mol %, and the Structure (Ib) recurring units are present in an amount of at least 25 and up to and including 60 mol %, all based on total recurring units in the polymeric binder,
    R is a substituted or unsubstituted hydroxyaryl group, and
    R$_2$ is a substituted or unsubstituted hydroxyaryl group in which the hydroxyl group is ortho to the ester linkage, and
    B) processing the exposed lithographic printing plate precursor with a developer composition to remove the exposed regions in the imageable layer, wherein the developer composition is a silicate-free and sugar-free alkaline aqueous developer composition having a pH of at least 12 and comprising:

(a) a hydroxide,
(b) a metal cation $M^{2+}$ selected from barium, calcium, strontium, and zinc cations,
(c) a chelating agent for the metal cation $M^{2+}$, and
(d) an alkali metal salt different than all of a, b, and c above.

2. The method of claim 1, wherein the metal cation $M^{2+}$ in the developer composition is calcium or strontium.

3. The method of claim 1, wherein the developer composition has a pH of at least 12 and up to and including 13.5.

4. The method of claim 1, wherein alkali metal salt of component (d) in the developer composition comprises a citrate, acetate, tartrate, nitrate, or oxalate.

5. The method of claim 1, wherein the chelating agent of component (c) in the developer composition has a complex formation constant (log K), when $M^{2+}$ is for the calcium metal cation $M^{2+}$, of at least 3.5 and less than or equal to 4.5, and a log K for aluminum ion that is 7 or less.

6. The method of claim 5, wherein the chelating agent of component (c) in the developer composition is a phosphono-polycarboxylic acid.

7. The method of claim 1, wherein the chelating agent of component (c) in the developer composition is 2-phosphonobutane-1,2,4-tricarboxylic acid.

8. The method of claim 1, wherein the metal cation $M^{2+}$ is present in the developer composition in an amount of at least 0.001 gram-atom/kg and up to and including 0.01 gram-atom/kg.

9. The method of claim 1 wherein the chelating agent of component (c) is present in the developer composition in an amount of at least 0.01 mol/liter and up to and including 0.1 mol/liter.

10. The method of claim 1, wherein the alkali metal salt of component (d) is present in the developer composition in an amount of at least 0.05 mol/liter and up to and including 0.2 mol/liter.

11. The method of claim 1, wherein the developer composition further comprises an anionic surfactant, a cationic surfactant, or betaine.

12. The method of claim 1, wherein the developer composition has a pH of at least 12 and up to and including 13.5, and comprises:

a sodium or potassium hydroxide,
sodium or potassium citrate,
$M^{2+}$ is calcium or strontium metal cation, and
the chelating agent has a complex formation constant (log K), when $M^{2+}$ is for the calcium metal cation, of at least 3.5 and less than or equal to 4.5, and a log K for aluminum ion that is less than or equal to 7.

13. The method of claim 1, wherein the positive-working lithographic printing plate precursor has an aluminum-containing substrate and the at least one imageable layer disposed on the substrate.

14. The method of claim 1, wherein the positive-working lithographic printing plate precursor has a single positive-working imageable layer disposed on an aluminum-containing substrate.

15. The method of claim 1, wherein the positive-working lithographic printing plate precursor has a surface imageable layer containing hydroxymandelic acid, an organic compound having at least one amino group and at least one carboxylic acid group directly linked to an aryl group, or both hydroxymandelic acid and at least one of the organic compounds.

16. The method of claim 1 that is carried out in a processing apparatus to which the developer composition is supplied as a concentrate that is diluted at least 1.5 times with an aqueous solution for use in step B.

17. The method of claim 1, wherein the hydroxide in the developer composition comprises an alkali metal in an amount of at least 0.1 gram-atom/kg and up to and, including 1 gram-atom/kg.

18. The method of claim 1, wherein the developer composition has a pH of at least 12 and up to and including 13.5, and comprises:

a sodium or potassium hydroxide,
sodium or potassium citrate,
$M^{2+}$ as calcium metal cation,
a phosphono-polycarboxylic acid chelating agent, and
a surfactant.

19. The method of claim 1, wherein the alkali metal salt different than all of a, b, and c is an alkali metal salt of an organic carboxylic acid.

* * * * *